United States Patent
Murata

(10) Patent No.: US 7,490,520 B2
(45) Date of Patent: Feb. 17, 2009

(54) PRESSURE SENSOR HAVING IMPROVED ARRANGEMENT OF SENSOR CHIP FOR MINIMIZING INFLUENCE OF EXTERNAL VIBRATIONS

(75) Inventor: Takeshi Murata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/976,929

(22) Filed: Oct. 30, 2007

(65) Prior Publication Data

US 2008/0098819 A1 May 1, 2008

(30) Foreign Application Priority Data

Oct. 31, 2006 (JP) ............... 2006-296354

(51) Int. Cl.
*G01L 7/08* (2006.01)
(52) U.S. Cl. .................................. 73/756
(58) Field of Classification Search ............ 73/756
See application file for complete search history.

(56) References Cited

U.S. PATENT DOCUMENTS 5,554,809 A * 9/1996 Tobita et al. ............. 73/700
5,625,151 A * 4/1997 Yamaguchi ................ 73/716
7,152,480 B2 12/2006 Nomura
7,216,546 B2 * 5/2007 Hayashi et al. ............. 73/708
7,225,679 B2 * 6/2007 Miyagawa et al. ........... 73/753

FOREIGN PATENT DOCUMENTS

| JP | H04-216676 | 8/1992 |
| JP | H08-261852 | 10/1996 |
| JP | H09-113393 | 5/1997 |
| JP | 2004-294295 | 10/2004 |
| JP | 2006-023109 | 1/2006 |

* cited by examiner

*Primary Examiner*—Andre J Allen
(74) *Attorney, Agent, or Firm*—Posz Law Group, PLC

(57) ABSTRACT

A pressure sensor, which is to be used in an environment involving vibrations, includes a case and a sensor chip. The case has an inner surface that is to be disposed perpendicular to a direction of the vibrations. The sensor chip is to sense a pressure in the environment and generate a sensing signal representative of the sensed pressure. The sensor chip has a pressure-receiving surface and is secured in the case with the pressure-receiving surface perpendicular to the inner surface of the case. With such an arrangement, since the pressure-receiving surface of the sensor chip is accordingly to be parallel to the direction of the vibrations, the influence of the vibrations on the pressure-receiving surface can be minimized. Consequently, high accuracy of the pressure sensor can be ensured.

14 Claims, 4 Drawing Sheets

PRESSURE SENSOR HAVING IMPROVED ARRANGEMENT OF SENSOR CHIP FOR MINIMIZING INFLUENCE OF EXTERNAL VIBRATIONS

CROSS-REFERENCE TO RELATED APPLICATION

This application is based on and claims priority from Japanese Patent Application No. 2006-296354, filed on Oct. 31, 2006, the content of which is hereby incorporated by reference in its entirety into this application.

BACKGROUND OF THE INVENTION

1. Technical Field of the Invention

The present invention relates generally to pressure sensors including a sensor chip for sensing pressure. More particularly, the invention relates to a pressure sensor that has an improved arrangement of sensor chip for minimizing the influence of external vibrations on the pressure sensor.

2. Description of the Related Art

Conventionally, pressure sensors, which include a sensor chip for sensing pressure, generally further include a case, a circuit chip, and a protective gel. The case has an inner end surface, on which the sensor and circuit chips are mounted, and an opening through which the protective gel is filled in the case to protect the sensor and circuit chips. Such a pressure sensor is disclosed, for example, in Japanese Patent First Publication No. 2006-23109.

FIG. 6 shows an existing pressure sensor 30, where a sensor chip 10 and a circuit chip 14 are fixed to an inner end surface 15b of a resin-made case 15 by an adhesive 20. A plurality of terminals 16 are disposed on the inner end surface 15b so as to partially protrude out of the case 15. Wire bonding 18 is applied to electrically connect between the sensor and circuit chips 10 and 14 and between the circuit chip 14 and the terminals 16. Further, to alleviate stress induced by temperature change, a glass seat 11 is interposed between the sensor chip 10 and the inner end surface 15b. A protective gel 19 is filled in the case 15 through an opening 15a of the case 15, so as to protect the sensor and circuit chips 10 and 14, the glass seat 11, and the wire bonding 18.

When the above pressure sensor 30 is installed in an environment with a pressure-receiving surface 10a of the sensor chip 10 perpendicular to the direction of external vibrations transmitted from the environment to the pressure sensor 30, the vibrations may cause the pressure-receiving surface 10a to be displaced by the inertia of the protective gel 19. Consequently, even when there is no change in the actual value of a pressure of the environment, the value of the pressure sensed by the pressure sensor 30 may change, thus resulting in a sensing error of the pressure sensor 30.

For example, as shown in FIG. 7, the pressure sensor 30 may be installed in an interior space formed in a door 40 of a vehicle to sense the air pressure change in the interior space caused by a collision against the door 40. In this case, however, since the pressure-receiving surface 10a of the sensor chip 10 is perpendicular to the direction of vibrations caused by opening and closing operation of the door 40, the vibrations may result in a sensing error of the pressure sensor 30.

To avoid the above problem, one may consider installing the pressure sensor 30 in the interior space of the door 40 with the pressure-receiving surface 10a of the sensor chip 10 parallel to the direction of vibrations. However, in this case, since the sensor and circuit chips 10 and 14 would align in the horizontal direction (i.e., the direction of vibrations), the length of the pressure sensor 30 in the horizontal direction would exceed that of the interior space, so that the pressure sensor 30 could not be accommodated in the interior space.

SUMMARY OF THE INVENTION

The present invention has been made in view of the above-mentioned problems.

According to one aspect of the invention, there is provided a pressure sensor that is to be used in an environment involving vibrations. The pressure sensor includes a case and a sensor chip. The case has an inner surface that is to be disposed perpendicular to a direction of the vibrations. The sensor chip is to sense a pressure in the environment and generate a sensing signal representative of the sensed pressure. The sensor chip has a pressure-receiving surface and is secured in the case with the pressure-receiving surface perpendicular to the inner surface of the case.

With the above arrangement, since the pressure-receiving surface of the sensor chip is accordingly to be parallel to the direction of the vibrations, the influence of the vibrations on the pressure-receiving surface can be minimized. Consequently, high accuracy of the pressure sensor can be ensured.

According to another aspect of the invention, the pressure sensor further includes a circuit chip to process the sensing signal generated by the sensor chip. The circuit chip is secured in the case without being aligned with the sensor chip in the direction of the vibrations.

With the above arrangement, even when the environment has only a limited available length in the direction of the vibrations, the pressure sensor still can be installed in the environment.

BRIEF DESCRIPTION OF THE DRAWINGS

The present invention will be understood more fully from the detailed description given hereinafter and from the accompanying drawings of preferred embodiments of the invention, which, however, should not be taken to limit the invention to the specific embodiments but are for the purpose of explanation and understanding only.

In the accompanying drawings.

DESCRIPTION OF PREFERRED EMBODIMENTS

Preferred embodiments of the present invention will be described hereinafter with reference to FIGS. 1-5.

It should be noted that, for the sake of clarity and understanding, identical components having identical functions in

First Embodiment

Figure 1:
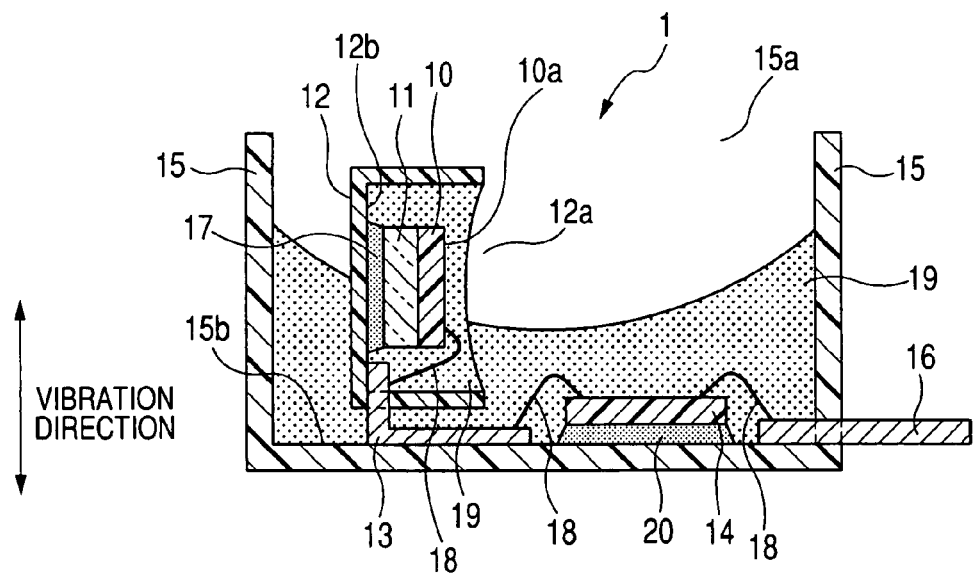
FIG. 1 is a schematic cross-sectional view of a pressure sensor according to the first embodiment of the invention.

FIG. 1 shows the overall structure of a pressure sensor 1 according to the first embodiment of the invention. The pressure sensor 1 is designed to be installed in an interior space formed in a door of a vehicle to sense the air pressure change in the interior space caused by a collision against the door.

The interior space may be formed between an outer panel on the outside and a door trim on the inner side of the door. Otherwise, when there is further provided an inner trim between the outer panel and the door trim, the interior space may formed either between the outer panel and the inner trim or between the inner trim and the door trim.

As shown in FIG. 1, the pressure sensor 1 includes a sensor chip 10, a glass seat 11, a sub case 12, a plurality of terminals 13, a circuit chip 14, a main case 15, and a plurality of terminals 16.

The sensor chip 10 includes a diaphragm (not shown) for sensing pressure. The diaphragm has a bridge circuit formed therein and a pressure-receiving surface that represents a pressure-receiving surface 10a of the sensor chip 10. When a pressure is applied to the sensor chip 10, the pressure-receiving surface 10a will be displaced, thereby causing the output of the bridge circuit to be accordingly changed. Thus, the pressure can be determined based on a sensing signal that is generated by the sensor chip 10 and representative of the output of the bridge circuit.

The glass seat 11 is provided to hold the sensor chip 10 with minimum stress induced by temperature change.

The sub case 12 is made of resin and has the shape of a cup with an opening 12a and an inner end surface (i.e., the inner surface of the closed end of the cup) 12b. The circuit chip 10 and the glass seat 11 are stacked on the inner end surface 12b so that the pressure-receiving surface 10a of the circuit chip 10 is parallel to the inner end surface 12b. Further, the glass seat 11 is fixed to the inner end surface 12b by an adhesive 17.

The terminals 13 are provided to send the sensing signal generated by the sensor chip 10 outside of the sub case 12 and to fix the sub case 12 to the main case 15. More specifically, the terminals 13 are made, for example, of Copper and have an "L" shape. The terminals 13 are each partially inserted in the sub case 12. The inserted portions of the terminals 13 are fixed, by an adhesive (not shown), to the inner end surface 12b of the sub case 12 in parallel with the pressure-receiving surface 10a of the sensor chip 10; the inserted portions are further electrically connected to the sensor chip 10 by wire bonding 18.

To protect the inserted portions of the terminals 13, the sensor chip 10, and the wire bonding 18, a protective member 19 is filled in the sub case 12 through the opening 12a. The protective member 19 is made of a highly insulative material, such as a Fluorine-based gel or rubber.

The circuit chip 14 is made up of a semiconductor chip including, for example, a MOS transistor. The circuit chip 14 has formed therein a circuit for processing the sensing signal generated by the sensor chip 10.

The main case 15 is also made of resin and has the shape of a cup with an opening 15a and an inner end surface 15b. The circuit chip 14 is fixed to the inner end surface 15b by an adhesive 20; the terminals 13 are also fixed to the inner end surface 15b by an adhesive (not shown). The terminals 13 are further electrically connected to the circuit chip 14 by wire bonding 18.

The terminals 16 are provided to electrically connect the circuit chip 14 with an external device or circuit. More specifically, the terminals 16 extend parallel to the inner end surface 15b of the main case 15 and are partially inserted in the main case 15. The inserted portions of the terminals 16 are fixed to the inner end surface 15b of the main case 15 by an adhesive (not shown); the inserted portions are further electrically connected to the circuit chip 14 by wire bonding 18.

To protect the portions of the terminals 13 outside the sub case 12, the circuit chip 14, and the inserted portions of the terminals 16, the main case 15 is also filled with the protective member 19 through the opening 15a.

After having described the overall structure of the pressure sensor 1, advantages thereof will now be described.

The pressure sensor 1 is to be installed in the interior space formed in the door of the vehicle with the inner end surface 15b of the main case 15 perpendicular to the vibration direction (i.e., the direction of vibrations caused by opening and closing operation of the door). More specifically, the pressure sensor 1 is to be fixed to a door trim of the vehicle by an adhesive such that the inner end surface 15b of the main case 15 is perpendicular to the horizontal direction (i.e., the vibration direction). Since the pressure-receiving surface 10a of the sensor chip 10 is perpendicular to the inner end surface 15b of the main case 15, it is accordingly parallel to the vibration direction after the installation.

With the above structure, when the air pressure in the interior space is changed due to a collision against the door, the diaphragm of the sensor chip 10 will be deformed, and the change in the air pressure will be represented by the sensing signal generated by the sensor chip 10. The sensing signal is then output to and processed in the circuit chip 14. After the processing, the sensing signal is further output to the external device or circuit via the terminals 16. On the other hand, when an opening and closing operation of the door is made, vibrations may be caused in the opening and closing direction (i.e., the horizontal direction) and transmitted to the pressure sensor 1. However, since the pressure-receiving surface 10a of the sensor chip 10 is parallel to the vibration direction, the deformation of the diaphragm of the sensor chip 10 due to the vibrations can be minimized. Consequently, high accuracy of the pressure sensor 1 can be ensured.

Further, in the pressure sensor 1, the sensor chip 10 is secured in the sub case 12, and the circuit chip 14 is directly fixed to the inner end surface 15b of the main case 15; the sensor and the circuit chips 10 and 14 are not aligned in the vibration direction.

With the above arrangement, even when the interior space in the door of the vehicle has only a limited available length in the vibration direction (i.e., the horizontal direction), the pressure sensor 1 still can be installed in the interior space.

In the pressure sensor 1, each of the terminals 13 has the "L" shape and is partially inserted in the sub case 12. Consequently, those portions of the terminals 13 which are fixed to the inner end surface 12b of the sub case 12 in parallel with the sensor chip 10 can be easily electrically connected to the sensor chip 10; the other portions which are fixed to the inner end surface 15b of the main case 15 in parallel with the circuit chip 14 can be easily electrically connected to the circuit chip 14.

In the pressure sensor 1, since the sensor chip 10 is received in the sub case 12, it is possible to protect the sensor chip 10 by filling the protective member 19 only in the sub case 12. Consequently, compared to the case of filling the entire main case 15, the amount of the protective member 19 required can be significantly reduced.

Second Embodiment

Figure 2:
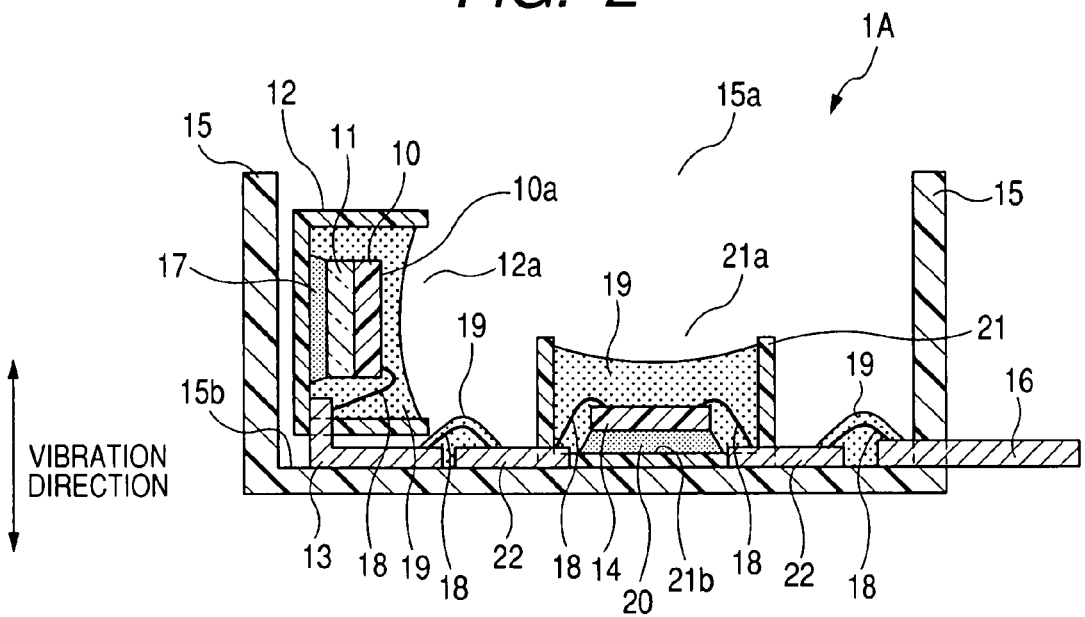
FIG. 2 is a schematic cross-sectional view of a pressure sensor according to the second embodiment of the invention.

FIG. 2 shows the overall structure of a pressure sensor 1A according to the second embodiment of the invention. The structure of the pressure sensor 1A is similar to that of the pressure sensor 1 according to the first embodiment; accordingly, only the differences therebetween will be described.

In the pressure sensor 1, as described previously, the circuit chip 14 is directly mounted to the main case 15.

In comparison, as shown in FIG. 2, the pressure sensor 1A further includes a sub case 21 and a plurality of terminals 22.

The sub case 21 is made of resin and has the shape of a cup with an opening 21a and an inner end surface 21b. The sub case 21 is disposed on the inner end surface 15b of the main case 15 so that the inner end surface 21b of the sub case 21 is parallel to the inner end surface 15b of the main case 15. The circuit chip 14 is received in the sub case 21 and fixed to the inner end surface 21b by the adhesive 20.

The terminals 22 are provided to electrically connect the circuit chip 14 with the terminals 13 and 16 and to fix the sub case 21 to the main case 15. More specifically, the terminals 22 extend parallel to the inner end surface 15b of the main case 15 and are partially inserted in the sub case 21. The terminals 22 are fixed to the inner end surface 15b of the main case 15 by an adhesive (not shown); the sub case 21 is accordingly fixed to the main case 15 via the terminals 22 with the circuit chip 14 parallel to the inner end surface 15b of the main case 15.

The inserted portions of the terminals 22 are electrically connected to the circuit chip 14 by wire bonding 18. Further, to protect the circuit chip 14, the inserted portions of the terminals 22, and the wire bonding 18, the sub case 21 is filled with the protective member 19 through the opening 21a.

The portions of the terminals 22 outside the sub case 21 are electrically connected to the terminals 13 or 22 by wire bonding 18. Further, the protective member 19 is applied to bury the wire bonging 18 connecting the terminals 22 to the terminals 13 or 22, thereby protecting it.

The above-described pressure sensor 1A also has the advantages of the pressure sensor 1 described in the previous embodiment.

Third Embodiment

Figure 3:
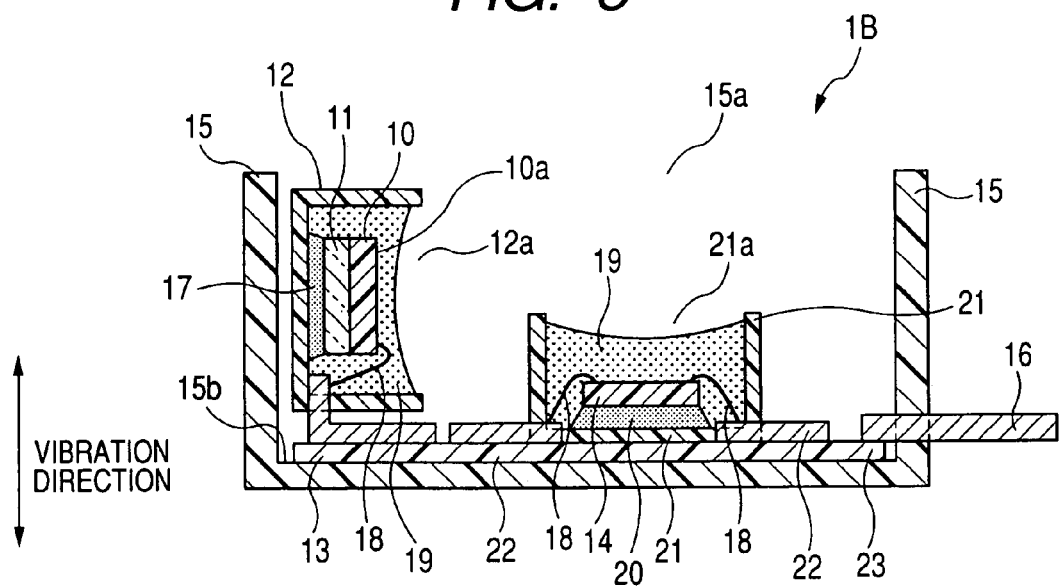
FIG. 3 is a schematic cross-sectional view of a pressure sensor according to the third embodiment of the invention.

FIG. 3 shows the overall structure of a pressure sensor 1B according to the third embodiment of the invention. The structure of the pressure sensor 1B is similar to that of the pressure sensor 1A according to the second embodiment; accordingly, only the differences therebetween will be described.

In the pressure sensor 1A, as described previously, the terminals 22 are electrically connected to the terminals 13 or 16 by the wire bonding 18.

In comparison, as shown in FIG. 3, the pressure sensor 1B further includes a printed wiring board 23 that electrically connects the terminals 22 to the terminals 13 or 16.

The printed wiring board 23 is made up of a glass epoxy board or flexible board, on which a conductive pattern (not shown) is formed by wiring patterns and contact pads. The printed wiring board 23 is fixed to the inner end surface 15b of the main case 15 by screws (not shown) or an adhesive (not shown). The terminals 13, 22, and 16 are joined to the corresponding contact pads on the printed wiring board 23 by soldering or welding. Consequently, the terminals 22 are electrically connected to the terminals 13 or 16 by the conductive pattern formed on the printed wiring board 23.

The above-described pressure sensor 1B has the same advantages as the pressure sensors 1 and 1A according to the previous embodiments.

Fourth Embodiment

Figure 4:
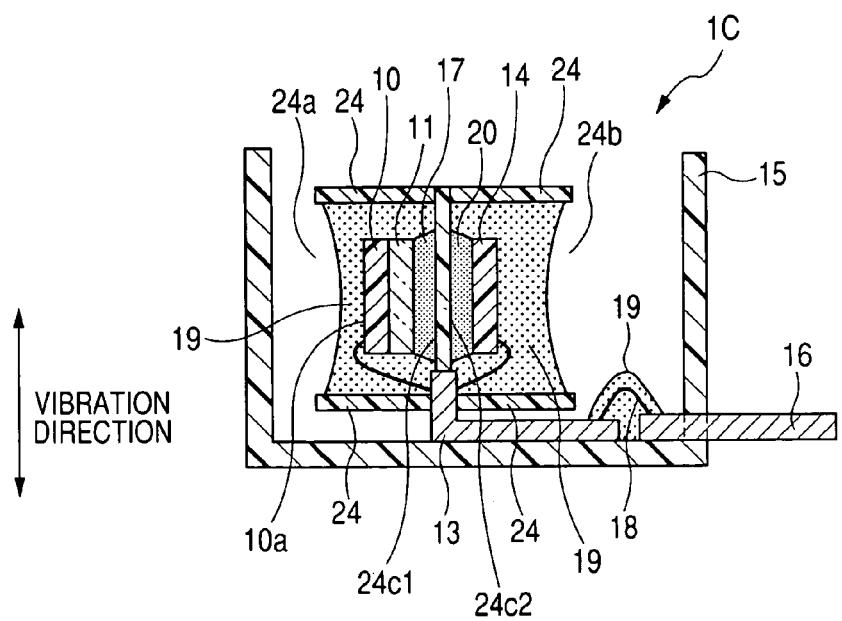
FIG. 4 is a schematic cross-sectional view of a pressure sensor according to the fourth embodiment of the invention.

FIG. 4 shows the overall structure of a pressure sensor 1C according to the fourth embodiment of the invention. The structure of the pressure sensor 1C is similar to that of the pressure sensor 1A according to the second embodiment; accordingly, only the differences therebetween will be described.

In the pressure sensor 1A, as described previously, the sensor chip 10 and the circuit chip 14 are respectively fixed in the sub cases 12 and 21. Further, the sub cases 12 and 21 are fixed to the inner end surface 15b of the main case 15 so that the sensor chip 10 is perpendicular to the inner end surface 15b, while the circuit chip 14 is parallel to the inner end surface 15b.

In comparison, as shown in FIG. 4, the pressure sensor 1C includes only a single sub case 24, instead of the sub cases 12 and 21, to receive both the sensor chip 10 and the circuit chip 14. Further, the sub case 24 is fixed to the inner end surface 15b of the main case 15 so that both the sensor chip 10 and the circuit chip 14 are perpendicular to the inner end surface 15b.

The sub case 24 is made of resin and has the shape of two cups that are integrated together with a common end wall. In other words, the sub case 24 is in two parts separated by a separation wall (i.e., the common end wall). More specifically, the sub case 24 has first and second openings 24a and 24b that are opposite to each other in the longitudinal direction of the sub case 24. The sub case 24 also has first and second inner end surfaces 24c1 and 24c2 that are respectively the surfaces of the common end wall of the sub case 24 facing the first and second openings 24a and 24b.

The sensor chip 10 and the circuit chip 14 are respectively fixed to the first and second inner end surfaces 24c1 and 24c2 of the sub case 24 in parallel with them. The sub case 24 is fixed, via the terminals 13 partially inserted in the sub case 24, to the inner end surface 15b of the main case 15 so that the first and second inner end surfaces 24c1 and 24c2 are perpendicular to the inner end surface 15b of the main case 15. Consequently, both the sensor chip 10 and the circuit chip 14 are perpendicular to the inner end surface 15b of the main case 15.

The electrical connection between the terminals 13 and the sensor and circuit chips 10 and 14 is made in the sub case 24 by wire bonding 18. To protect all the components in the sub case 24, the protective member 19 is filled in the sub case 24 through both the first and second openings 24a and 24b. On the other hand, the electrical connection between the terminals 13 and the terminals 16 is made outside of the sub case 24 by wire bonding 18. The protective member 19 is applied to bury the wire bonding 18 connecting the terminals 13 and 16, thereby protecting it. Consequently, compared to the case of filling the entire main case 15, the amount of the protective member 19 required can be significantly reduced.

The above-described pressure sensor 1C has the same advantages as the pressure sensors 1, 1A, and 1B according to the previous embodiments.

Fifth Embodiment

Figure 5:
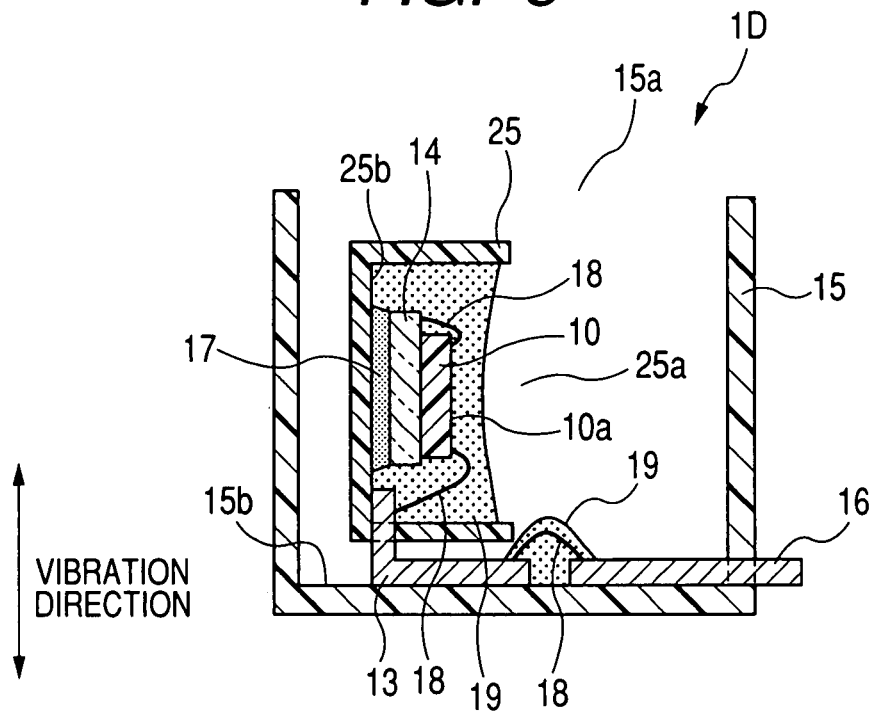
FIG. 5 is a schematic cross-sectional view of a pressure sensor according to the fifth embodiment of the invention.
Figure 6:
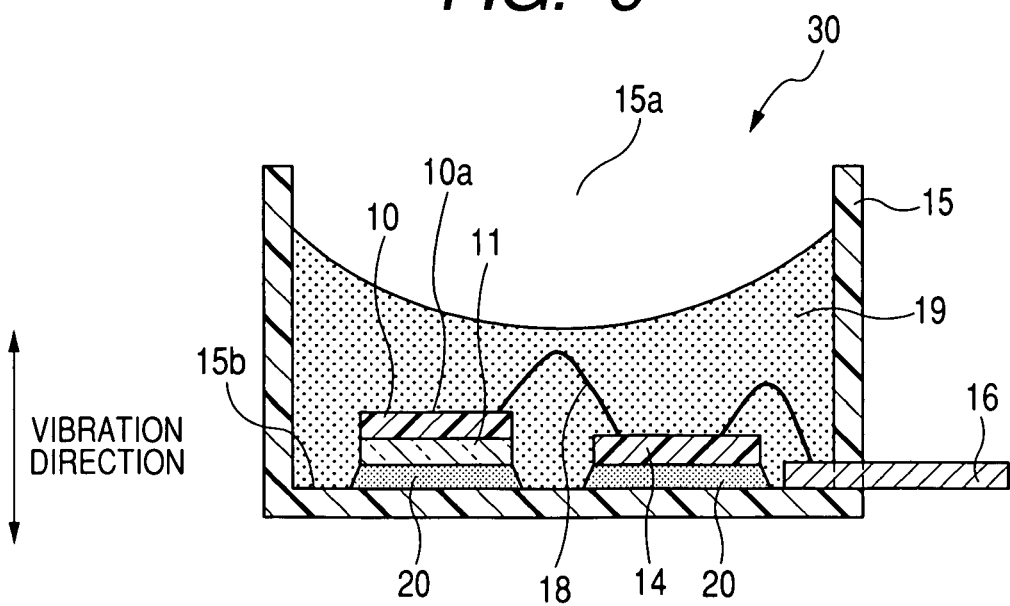
FIG. 6 is a schematic cross-sectional view of an existing pressure sensor.
Figure 7:
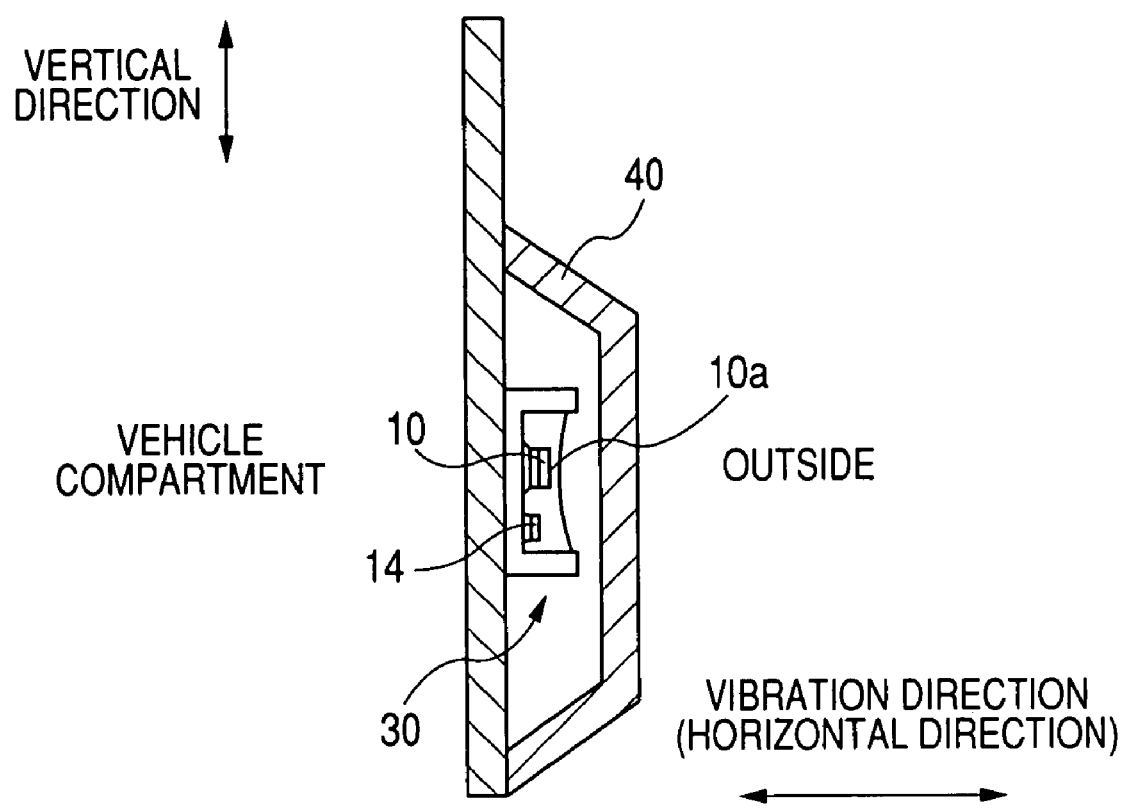
FIG. 7 is a schematic view illustrating the existing pressure sensor installed in an interior space formed in a door of a vehicle.

FIG. 5 shows the overall structure of a pressure sensor 1D according to the fifth embodiment of the invention. The structure of the pressure sensor 1D is similar to that of the pressure sensor 1A according to the second embodiment; accordingly, only the differences therebetween will be described.

In the pressure sensor 1A, as described previously, the sensor chip 10 and the circuit chip 14 are respectively secured in the sub cases 12 and 21. Further, the sub cases 12 and 21 are fixed to the inner end surface 15b of the main case 15 so that the sensor chip 10 is perpendicular to the inner end surface 15b, while the circuit chip 14 is parallel to the inner end surface 15b.

In comparison, as shown in FIG. 5, the pressure sensor 1D includes only a single sub case 25, instead of the sub cases 12 and 21, to receive both the sensor chip 10 and the circuit chip 14. Further, the sub case 25 is fixed to the inner end surface 15b of the main case 15 so that both the sensor chip 10 and the circuit chip 14 are perpendicular to the inner end surface 15b.

The sub case 25 is made of resin and has the shape of a cup with an opening 25a and an inner end surface 25b. The circuit chip 14 is fixed to the inner end surface 25b of the sub case 25 by an adhesive 17. The sensor chip 10 is stacked on the circuit chip 14. The terminals 13 are partially inserted in the sub case 25 to hold the sub case 25. The electrical connection between the circuit chip 10, and the circuit chip 14 and the terminals is made in the sub case 25 by wire bonding 18. To protect all the components in the sub case 25, the protective member 19 is filled in the sub case 25 through the opening 25a. On the other hand, the electrical connection between the terminals 13 and the terminals 16 is made outside of the sub case 25 by wire bonding 18. The protective member 19 is applied to bury the wire bonding 18 connecting the terminals 13 and 16, thereby protecting it. Consequently, compared to the case of filling the entire main case 15, the amount of the protective member 19 required can be significantly reduced.

The above-described pressure sensor 1D has the same advantages as the pressure sensors 1, 1A, 1B, and 1C according to the previous embodiments.

Other Embodiments

While the above particular embodiments of the invention have been shown and described, it will be understood by those skilled in the art that various modifications, changes, and improvements may be made without departing from the spirit of the invention.

(1) The previous embodiments are directed to the pressure sensors that are to be installed in an interior space formed in a door of a vehicle to sense the air pressure change in the interior space caused by a collision against the door. However, the invention also can be applied to pressure sensors for other uses.

(2) In the previous embodiments, the pressure sensors are to be fixed to a door trim by an adhesive. However, it is also possible to fix the pressure sensors to the door trim by other means, for example bolts.

(3) In the previous embodiments, the terminals 13 are fixed to the inner end surface 15b of the main case 15 by an adhesive. However, the terminals 13 also can be fixed to the inner end surface 15b by other means, for example soldering.

What is claimed is:

1. A pressure sensor to be used in an environment involving vibrations, the pressure sensor comprising:
 a case having an inner surface that is to be disposed perpendicular to a direction of the vibrations; and
 a sensor chip to sense a pressure in the environment and generate a sensing signal representative of the sensed pressure, the sensor chip having a pressure-receiving surface and secured in the case with the pressure-receiving surface perpendicular to the inner surface of the case.

2. The pressure sensor as set forth in claim 1, wherein the environment is an interior space formed in a door of a vehicle, and the vibrations are caused by opening and closing operation of the door.

3. The pressure sensor as set forth in claim 1, further comprising a circuit chip to process the sensing signal generated by the sensor chip, wherein the circuit chip is secured in the case without being aligned with the sensor chip in the direction of the vibrations.

4. The pressure sensor as set forth in claim 3, further comprising a sub case and a plurality of terminals, wherein
 the sensor chip is fixed in the sub case,
 the sub case is received in the case and fixed to the inner surface of the case via the terminals, and
 the circuit chip is received in the case and fixed to the inner surface of the case in parallel with the inner surface.

5. The pressure sensor as set forth in claim 4, wherein
 the terminals are each partially inserted in the sub case,
 portions of the terminals inside the sub case are electrically connected to the sensor chip by wire bonding, and
 a protective member is provided in the sub case to protect the sensor chip, the portions of the terminals inside the sub case, and the wire bonding.

6. The pressure sensor as set forth in claim 5, wherein
 portions of the terminals outside the sub case are electrically connected to the circuit chip by wire bonding, and
 a protective member is provided in the case to protect the circuit chip, the portions of the terminals outside the sub case, and the wire bonding outside the sub case.

7. The pressure sensor as set forth in claim 3, further comprising first and second sub cases, a plurality of first terminals, and a plurality of second terminals, wherein
 the sensor chip is fixed in the first sub case,
 the first sub case is received in the case and fixed to the inner surface of the case via the first terminals,
 the circuit chip is fixed in the second sub case, and
 the second sub case is received in the case and fixed to the inner surface of the case via the second terminals, so that the circuit chip is parallel to the inner surface of the case.

8. The pressure sensor as set forth in claim 7, wherein
 the first terminals are each partially inserted in the first sub case,
 portions of the first terminals inside the first sub case are electrically connected to the sensor chip by wire bonding,
 a protective member is provided in the first sub case to protect the sensor chip, the portions of the first terminals inside the first sub case, and the wiring boding inside the first sub case,
 the second terminals are each partially inserted in the second sub case,
 portions of the second terminals inside the second sub case are electrically connected to the circuit chip by wire bonding, and
 a protective member is provided in the second sub case to protect the circuit chip, the portions of the second terminals inside the second sub case, and the wire bonding inside the second sub case.

9. The pressure sensor as set forth in claim 8, wherein
 portions of the first terminals outside the first sub case are electrically connected to portions of the second terminals outside the second sub case by wire bonding, and
 a protective member is provided in the case to protect the portions of the first terminals outside the first sub case, the portions of the second terminals outside the second sub case, and the wire bonding outside the first and second sub cases.

10. The pressure sensor as set forth in claim 8, further comprising a printed wiring board that has a conductive pattern formed thereon and is arranged on the inner surface of the case, wherein portions of the first terminals outside the first sub case are electrically connected to portions of the second terminals outside the second sub case by the conductive pattern formed on the printed wiring board.

11. The pressure sensor as set forth in claim 3, further comprising a sub case and a plurality of terminals, wherein
the sub case is in two parts separated by a separation wall that has first and second surfaces that are parallel to each other and face in opposite directions;
the sensor and circuit chips are respectively received in the two parts of the sub case, and respectively fixed to the first and second surfaces of the separation wall in parallel with the first and second surfaces, and
the sub case is received in the case and fixed to the inner surface of the case via the terminals, so that the first and second surfaces of the separation wall are perpendicular to the inner surface of the case.

12. The pressure sensor as set forth in claim 11, wherein
the terminals are each partially inserted in the sub case,
the sensor and circuit chips are electrically connected to portions of the terminals inside the sub case by wire boding, and
a protective member is provided in the sub case to protect the sensor and circuit chips, the portions of the terminals inside the sub case, and the wire bonding.

13. The pressure sensor as set forth in claim 3, further comprising a sub case and a plurality of terminals, wherein
the sensor and circuit chips are received in the sub case and stacked on an inner surface of the sub case in parallel with the inner surface of the sub case, and
the sub case is received in the case and fixed to the inner surface of the case via the terminals, so that the inner surface of the sub case is perpendicular to the inner surface of the case.

14. The pressure sensor as set forth in claim 13, wherein
the terminals are each partially inserted in the sub case,
the sensor chip is electrically connected to the circuit chip and portions of the terminals inside the sub case by wire bonding, and
a protective member is provided in the sub case to protect the sensor and circuit chips, the portions of the terminals inside the sub case, and the wire bonding.

* * * * *